US012708203B2

(12) United States Patent
Chen et al.

(10) Patent No.: US 12,708,203 B2
(45) Date of Patent: Aug. 18, 2026

(54) SLIDE RAIL KIT

(71) Applicants: King Slide Works Co., Ltd., Kaohsiung City (TW); King Slide Technology Co., Ltd., Kaohsiung City (TW)

(72) Inventors: Ken-Ching Chen, Kaohsiung City (TW); Shun-Ho Yang, Kaohsiung City (TW); Ya-Yin Jhang, Kaohsiung City (TW); Chun-Chiang Wang, Kaohsiung City (TW)

(73) Assignees: King Slide Works Co., Ltd., Kaohsiung City (TW); King Slide Technology Co., Ltd., Kaohsiung City (TW)

( * ) Notice: Subject to any disclaimer, the term of this patent is extended or adjusted under 35 U.S.C. 154(b) by 133 days.

(21) Appl. No.: 18/796,756

(22) Filed: Aug. 7, 2024

(65) Prior Publication Data

US 2025/0194797 A1 Jun. 19, 2025

(30) Foreign Application Priority Data

Dec. 18, 2023 (TW) ................................ 112149489

(51) Int. Cl.

| | |
|---|---|
| ***H05K 7/14*** | (2006.01) |
| ***A47B 88/43*** | (2017.01) |
| ***H05K 7/18*** | (2006.01) |
| *A47B 88/49* | (2017.01) |

(52) U.S. Cl.
CPC ........... *A47B 88/43* (2017.01); *H05K 7/1489* (2013.01); *A47B 88/49* (2017.01); *H05K 7/183* (2013.01)

(58) Field of Classification Search
CPC ...... A47B 88/43; A47B 88/49; H05K 7/1489; H05K 7/183
See application file for complete search history.

(56) References Cited

U.S. PATENT DOCUMENTS

| | | | | |
|---|---|---|---|---|
| 10,064,485 B2 | 9/2018 | Chen et al. | | |
| 10,225,945 B2 | 3/2019 | Chen et al. | | |
| 11,717,085 B2 * | 8/2023 | Nilsson | ................ | A47B 95/008 211/182 |
| 2018/0084907 A1 * | 3/2018 | Chen | ...................... | A47B 57/34 |
| 2019/0274427 A1 * | 9/2019 | Chen | ...................... | A47B 88/43 |
| 2019/0365097 A1 * | 12/2019 | Chen | .................... | A47B 88/407 |
| 2022/0087421 A1 * | 3/2022 | Chen | ...................... | H05K 7/183 |
| 2025/0311847 A1 * | 10/2025 | Chen | .................... | A47B 88/407 |

FOREIGN PATENT DOCUMENTS

| | | |
|---|---|---|
| CN | 106358416 A | 1/2017 |
| CN | 107484382 B | 7/2020 |
| EP | 3253188 A1 | 12/2017 |

* cited by examiner

*Primary Examiner* — Kimberley S Wright
(74) *Attorney, Agent, or Firm* — Best & Flanagan LLP

(57) ABSTRACT

A slide rail kit includes a first rail, a second rail and a bracket device. The first rail has an outer side and an inner side. The second rail is movable relative to the first rail and located adjacent to the inner side of the first rail. The bracket device is arranged on the first rail and includes a rack mounting feature. A recessed structure is formed at the outer side of the first rail and adjacent to the rack mounting feature.

9 Claims, 8 Drawing Sheets

SLIDE RAIL KIT

BACKGROUND OF THE INVENTION

1. Field of the Invention

The present invention relates to a slide rail kit, and more particularly, to a slide rail kit applicable to a rack.

2. Description of the Prior Art

U.S. Pat. No. 10,225,945 B2 discloses a slide rail assembly comprises a first rail, a second rail, a third rail and an extension member. The first rail has a first channel. The second rail is movable relative to the first rail. The third rail is movably mounted between the first rail and the second rail. The extension member is connected to the first rail. A surface of the extension member and an outer surface of the third rail are substantially located on a same plane. In order to reduce lateral space occupied by the first rail at two sides of a rack (or a cabinet), the first rail is designed to be shorter, such that the whole first rail can be placed within a space between a front post and a rear post of the rack. According to such arrangement, the second rail can carry a carried object (such as a chassis) with a larger width. However, the length of the first rail is limited, such that overall structural strength of the slide rail is reduced, and the additional extension member is required, so as to increase assembly complexity of the slide rail assembly.

Therefore, for different market requirements, it is important to develop various slide rail products.

SUMMARY OF THE INVENTION

The present invention relates to a slide rail kit applicable to a rack.

According to an embodiment of the present invention, a slide rail kit is configured to be mounted to a rack having a first side frame and a second side frame. The slide rail kit comprises a first rail, a second rail and a bracket device. The first rail has an outer side and an inner side. The second rail is longitudinally movable relative to the first rail and adjacent to the inner side of the first rail. The bracket device is arranged on the first rail. A recessed structure is formed at the outer side of the first rail and recessed toward the inner side of the first rail, and a concave space is defined by the recessed structure. The first rail is configured to be mounted to the first side frame of the rack through the bracket device, and the recessed structure of the first rail is configured to allow a predetermined part of the first side frame of the rack to extend into the concave space.

According to another embodiment of the present invention, a slide rail kit comprises a first rail and a bracket device. The first rail has an outer side. The bracket device is arranged on the first rail and comprises a rack mounting feature. A recessed structure is formed at the outer side of the first rail and adjacent to a lateral side of the rack mounting feature.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
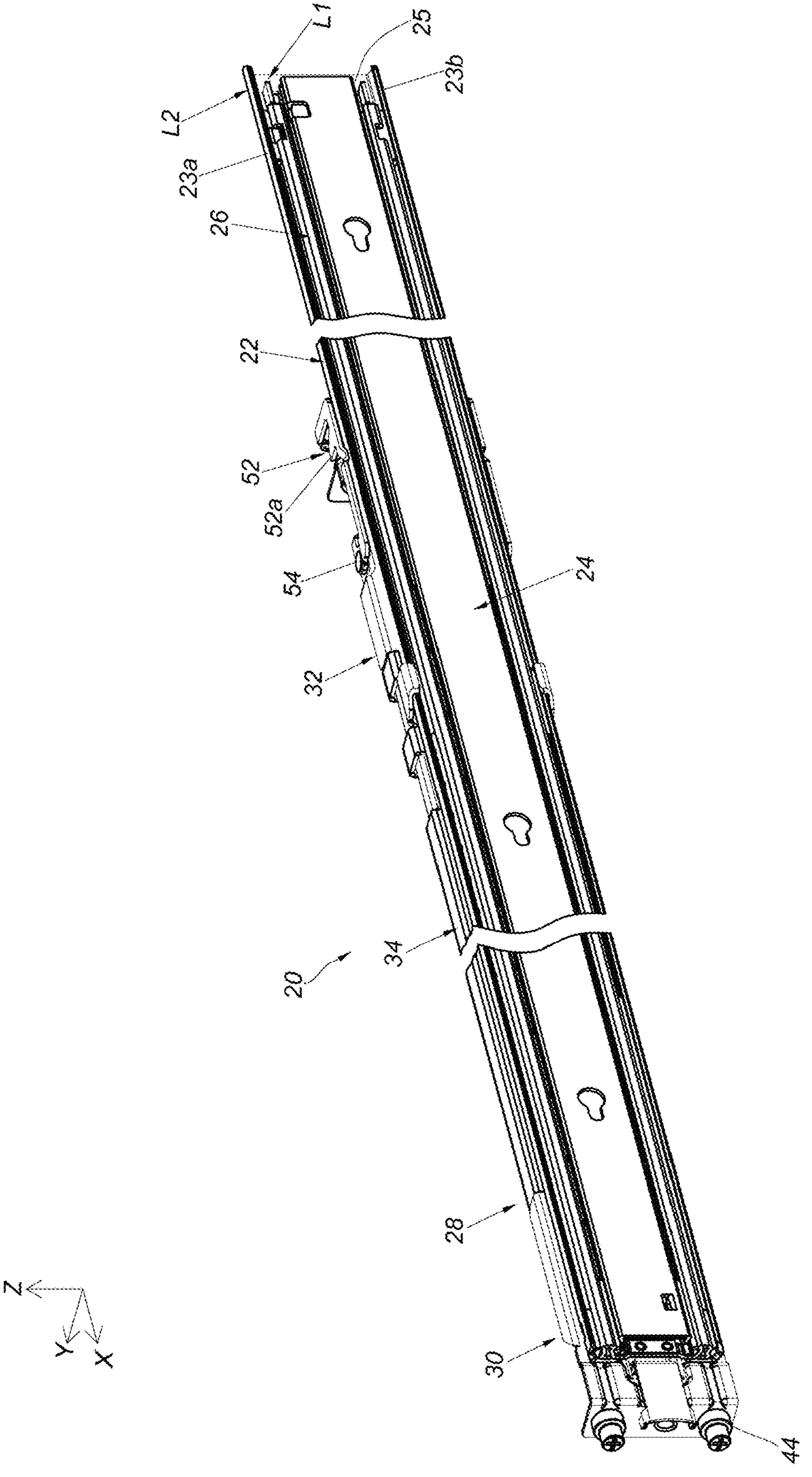
FIG. 1 is a diagram showing a slide rail kit in a first viewing angle according to a first embodiment of the present invention.

As shown in FIG. 1, a slide rail kit 20 comprises a first rail 22, a second rail 24 and a third rail 26 according to a first embodiment of the present invention. The first rail 22, the second rail 24 and the third rail 26 are longitudinally movable relative to each other. In the figures, the X axis is a longitudinal direction (or a length direction or a moving direction of the slide rail), the Y axis is a transverse direction (or a lateral direction of the slide rail), and the Z axis is a vertical direction (or a height direction of the slide rail). The third rail 26 is movably mounted between the first rail 22 and the second rail 24. The first rail 22 has an inner side L1 and an outer side L2 opposite to each other.

Preferably, the first rail 22 comprises a first wall 23*a*, a second wall 23*b* and a longitudinal wall 25 connected between the first wall 23*a* and the second wall 23*b* of the first rail 22. A passage is defined by the first wall 23*a*, the second wall 23*b* and the longitudinal wall 25, and configured to accommodate the third rail 26 at the inner side L1 of the first rail 22. The second rail 24 is located adjacent to the inner side L1 of the first rail 22. In the present embodiment, the second rail 24 is mounted to the third rail 26 to be adjacent to the inner side L1 of the first rail 22.

Figure 2:
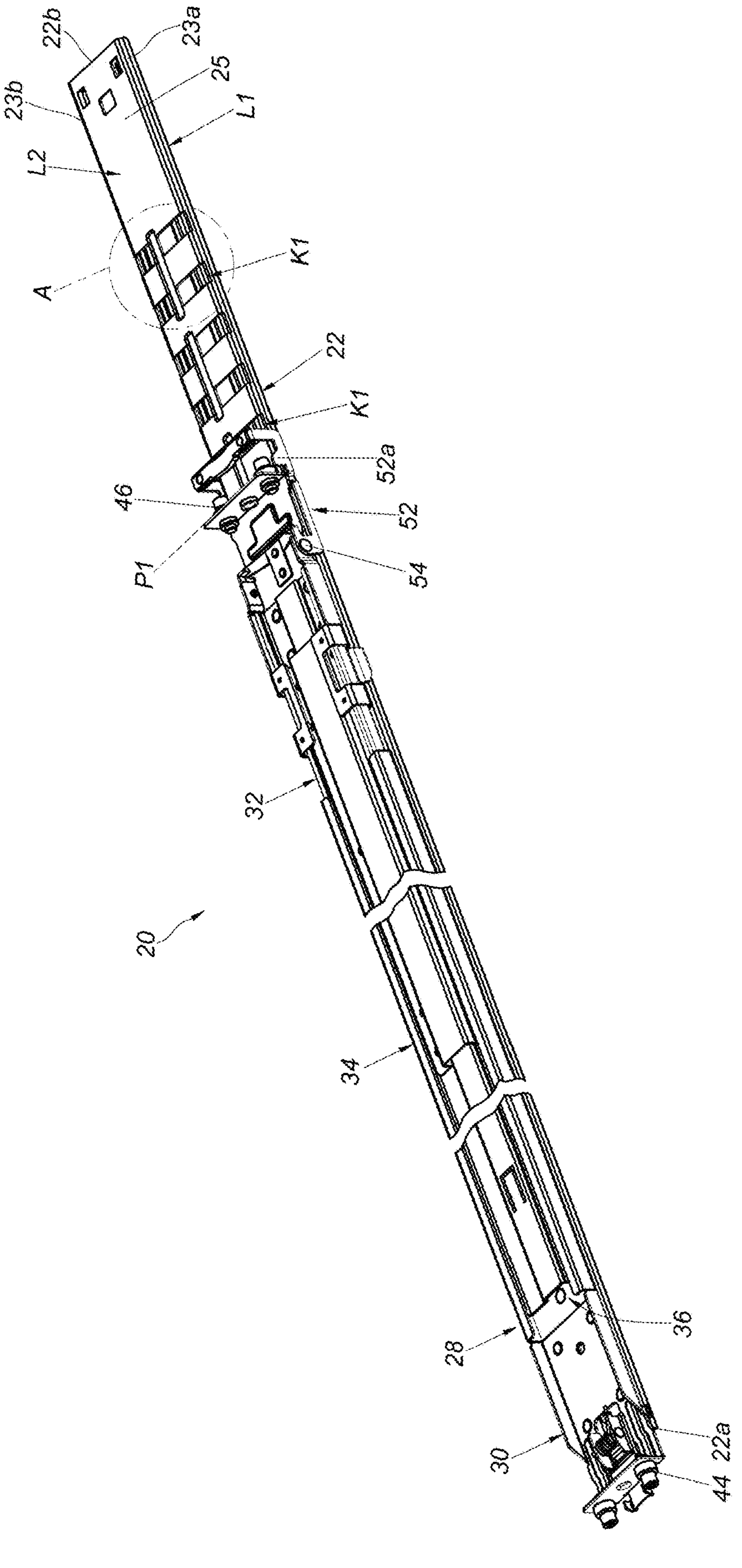
FIG. 2 is a diagram showing the slide rail kit in a second viewing angle with a bracket located at a first mounting position according to the first embodiment of the present invention.

As shown in FIG. 2, the slide rail kit 20 further comprises a bracket device 28 arranged on the first rail 22. For example, the bracket device 28 is arranged at the outer side L2 of the first rail 22. Specifically, the bracket device 28 comprises a first bracket 30 and a second bracket 32. Preferably, one of the first bracket 30 and the second bracket 32 is longitudinally movable relative to the first rail 22. In the present embodiment, the second bracket 32 is longitudinally movable relative to the first rail 22.

Figure 4:
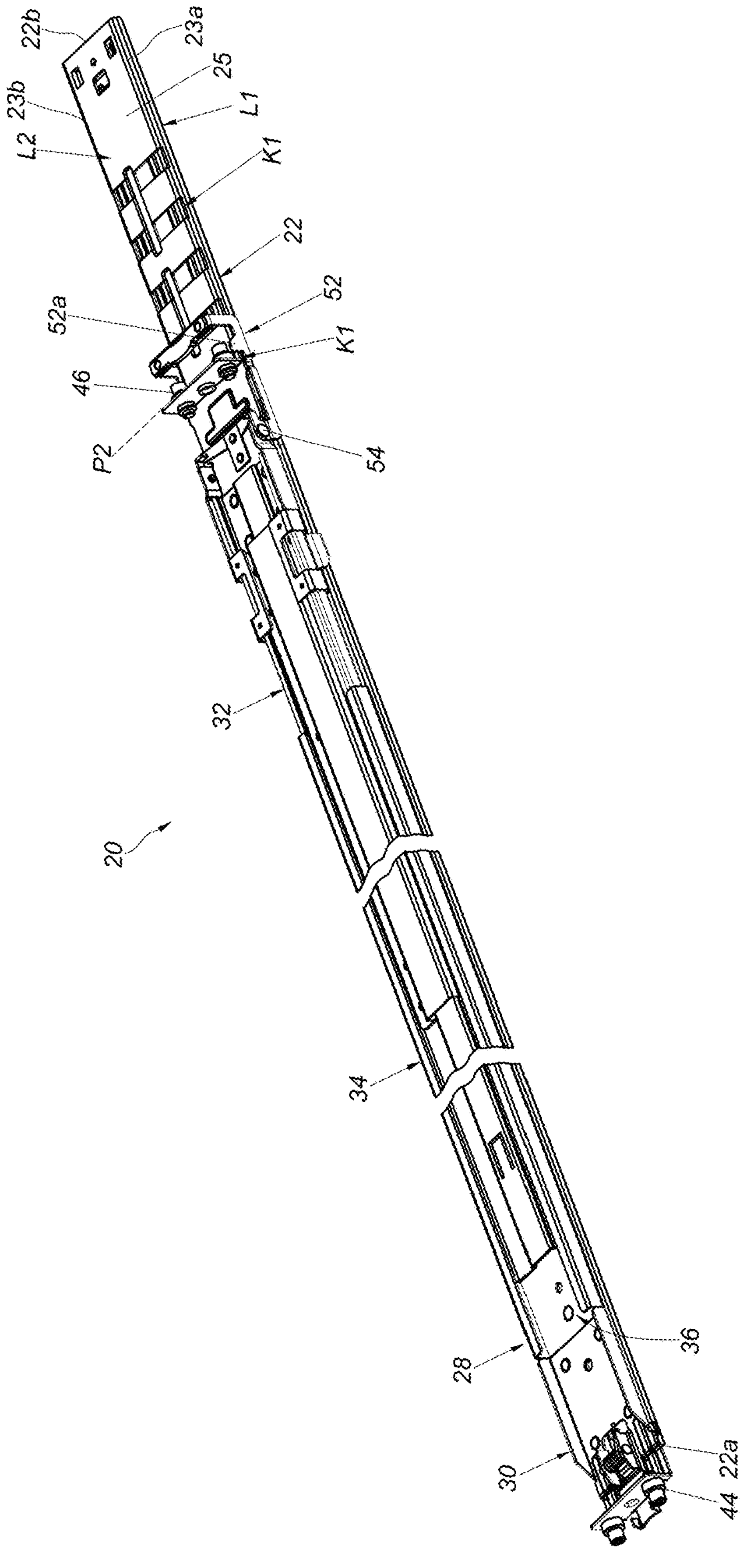
FIG. 4 is a diagram showing the slide rail kit in the second viewing angle with the bracket located at a second mounting position according to the first embodiment of the present invention.

Preferably, a supporting frame 34 is fixedly mounted to the outer side L2 of the first rail 22, and the supporting frame 34 is formed with a supporting passage 36 configured to movably mount the second bracket 32, such that the second bracket 32 can be longitudinally moved relative to the first rail 22 for adjusting its position. For example, the second bracket 32 can be moved to a first mounting position P1 relative to the first rail 22 (or, the second bracket 32 can be moved to a second mounting position P2 relative to the first rail 22 as shown in FIG. 4).

Preferably, the first rail 22 has a first end part 22*a* and a second end part 22*b* opposite to each other, such as a front end part and a rear end part, but the present invention is not limited thereto. The first bracket 30 is fixedly mounted adjacent to the first end part 22*a* of the first rail 22. The second bracket 32 is away from the first end part 22*a* of the first rail 22.

Preferably, the outer side L2 of the first rail 22 is formed with at least one recessed structure. In the present embodiment, the outer side L2 of the first rail 22 is formed with a plurality of recessed structures K1, but the number of the recessed structures K1 is not limited in the present invention. The recessed structures K1 have substantially identical structural configuration, and are spaced from each other by a predetermined longitudinal distance.

Figure 3:
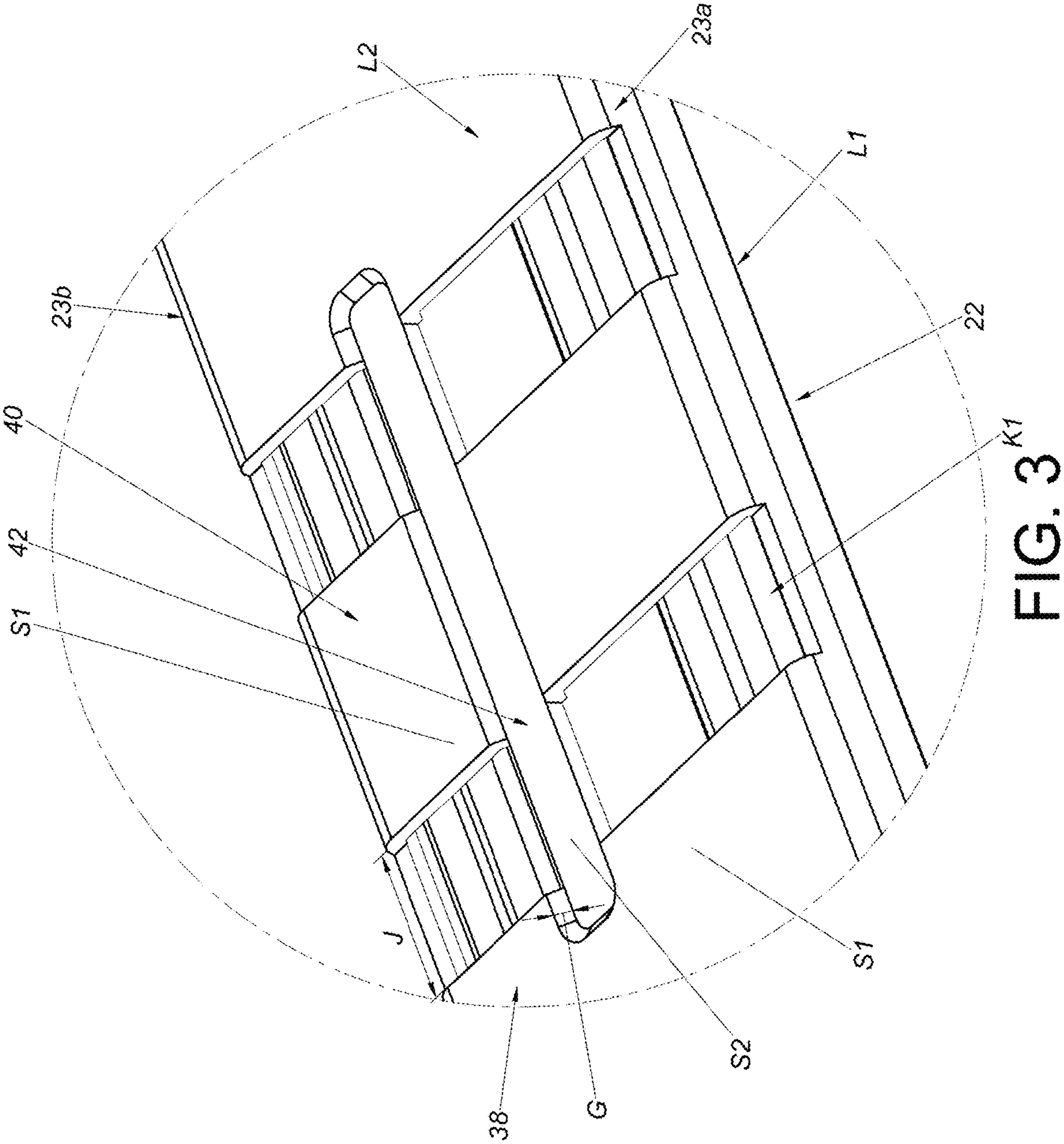
FIG. 3 is an enlarged view of an area A of FIG. 2.

As shown in FIGS. 2 and 3, the recessed structures K1 are formed on the longitudinal wall 25 and located at the outer side L2 of the first rail 22. In FIG. 3, the structural configuration of the recessed structure K1 is shown. The recessed structure K1 is recessed from the outer side L2 of the first rail 22 toward the inner side L1 of the first rail 22.

Preferably, the recessed structure K1 is partially formed on at least one of the first wall 23*a* and the second wall 23*b* of the first rail 22. Furthermore, in addition to being partially formed on the longitudinal wall 25 at the outer side L2 of the first rail 22, the recessed structure K1 is also partially formed on the first wall 23*a* and the second wall 23*b* of the first rail 22.

Preferably, the recessed structure K1 is formed on a predetermined rail section J of the first rail 22.

Preferably, the longitudinal wall 25 has a plurality of first surfaces S1 and a second surface S2 at the outer side L2 of the first rail 22, and the second surface S2 is located (for example, connected or extended) between the first surfaces S1. The first surface S1 and the second surface S2 are spaced apart from each other by a transverse distance G along the transverse direction (the Y-axis direction) as shown in FIG. 3. The first surface S1 and the second surface S2 are located at different transverse positions along the transverse direction. For example, the first surfaces S1 are located at a same first transverse position, and the second surface S2 is located at a second transverse position different from the first transverse position, such that the second surface S2 and the first surface S1 are spaced apart from each other by the transverse distance G along the transverse direction. Therefore, a concave space defined by the recessed structure K1 is formed above the second surface S2. Furthermore, a transverse space range of the concave space is defined by the transverse distance G, and a longitudinal space range of the concave space is defined by a length of the predetermined rail section J (please refer to FIG. 3). In the present embodiment, a portion of the recessed structure K1 forms a concave surface (such as the second surface S2) relative to the first surface S1, and a portion of the recessed structure K1 forms a through hole on the longitudinal wall 25 of the first rail 22 (between the second surface S2 and the first wall 23*a*/second wall 23*b*), but the present invention is not limited thereto. In other embodiments of the present embodiment, the recessed structure K1 only forms a concave surface without forming a through hole.

Preferably, the longitudinal wall 25 of the first rail 22 comprises a first longitudinal section 38, a second longitudinal section 40 and a rib 42 connected between the first longitudinal section 38 and the second longitudinal section 40. Each of the first longitudinal section 38 and the second longitudinal section 40 has the first surface S1, and the rib 42 has the second surface S2.

Preferably, the recessed structure K1 is located adjacent to the second end part 22*b* of the first rail 22.

As shown in FIG. 4, each of the first bracket 30 and the second bracket 32 comprises at least one rack mounting feature. For example, the first bracket 30 comprises at least one first rack mounting feature 44, and the second bracket 32 comprises at least one second rack mounting feature 46. In addition, a user can move the second bracket 32 to a corresponding position adjacent to one of the recessed structures K1. For example, the second bracket 32 can be moved to the second mounting position P2 relative to the first rail 22 to be adjacent to the recessed structure K1; or, the second bracket 32 can be moved to another mounting position relative to the first rail 22 to be adjacent to another recessed structure K1.

Figure 5:
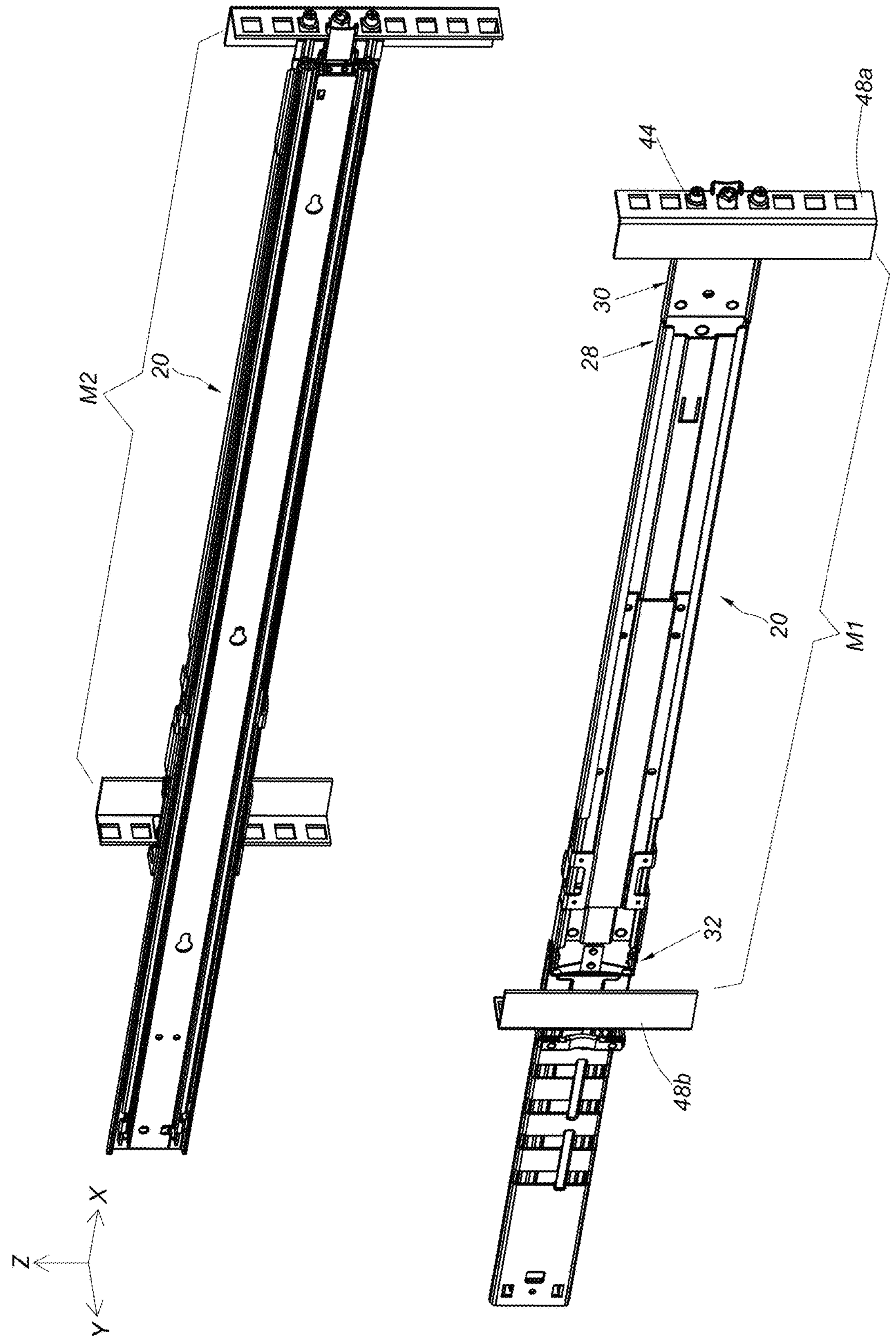
FIG. 5 is a diagram showing a pair of the slide rail kits being mounted to a rack according to the first embodiment of the present invention.
Figure 6:
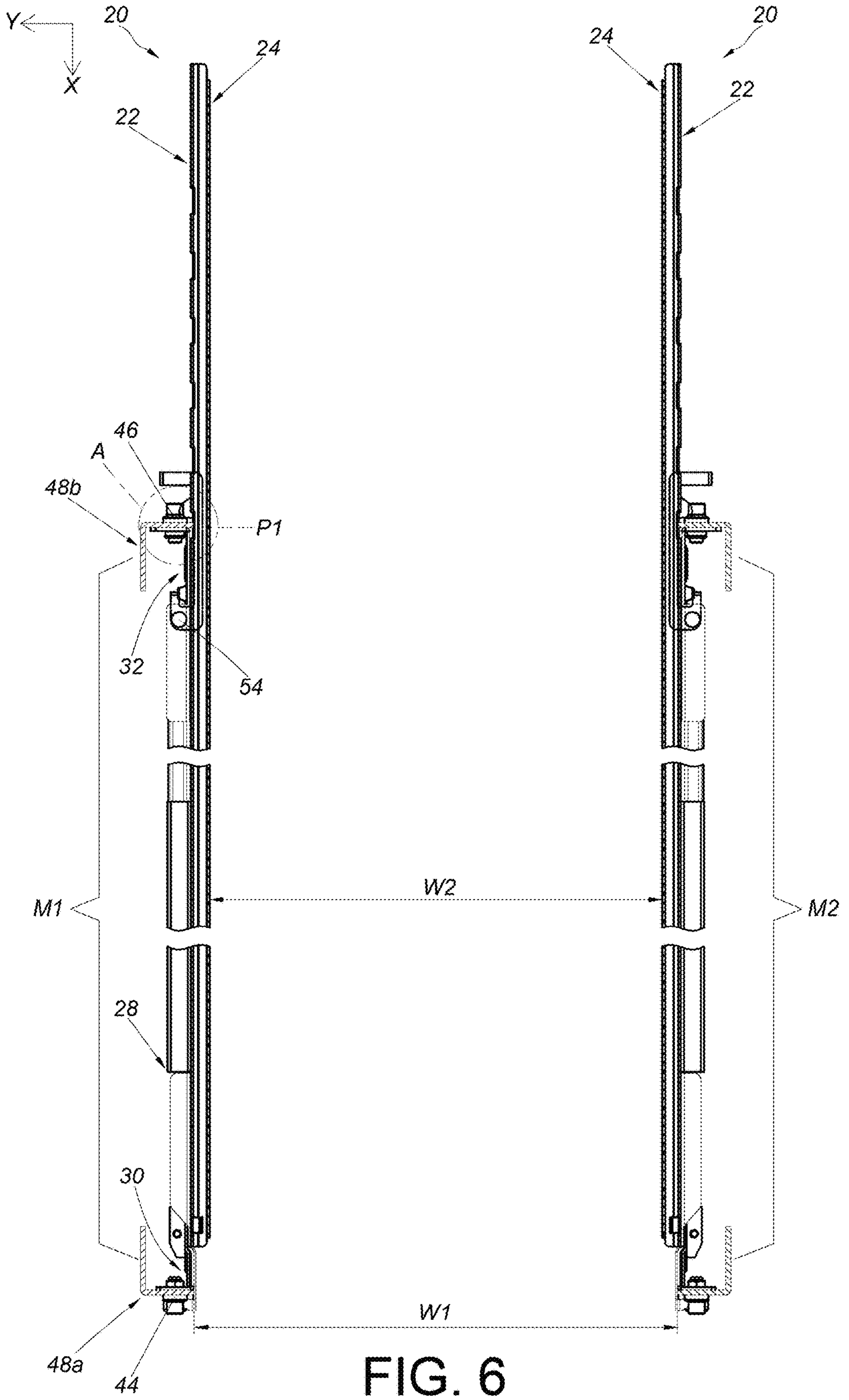
FIG. 6 is a diagram showing the slide rail kits being respectively mounted to a first side frame and a second side frame of the rack according to the first embodiment of the present invention.
Figure 7:
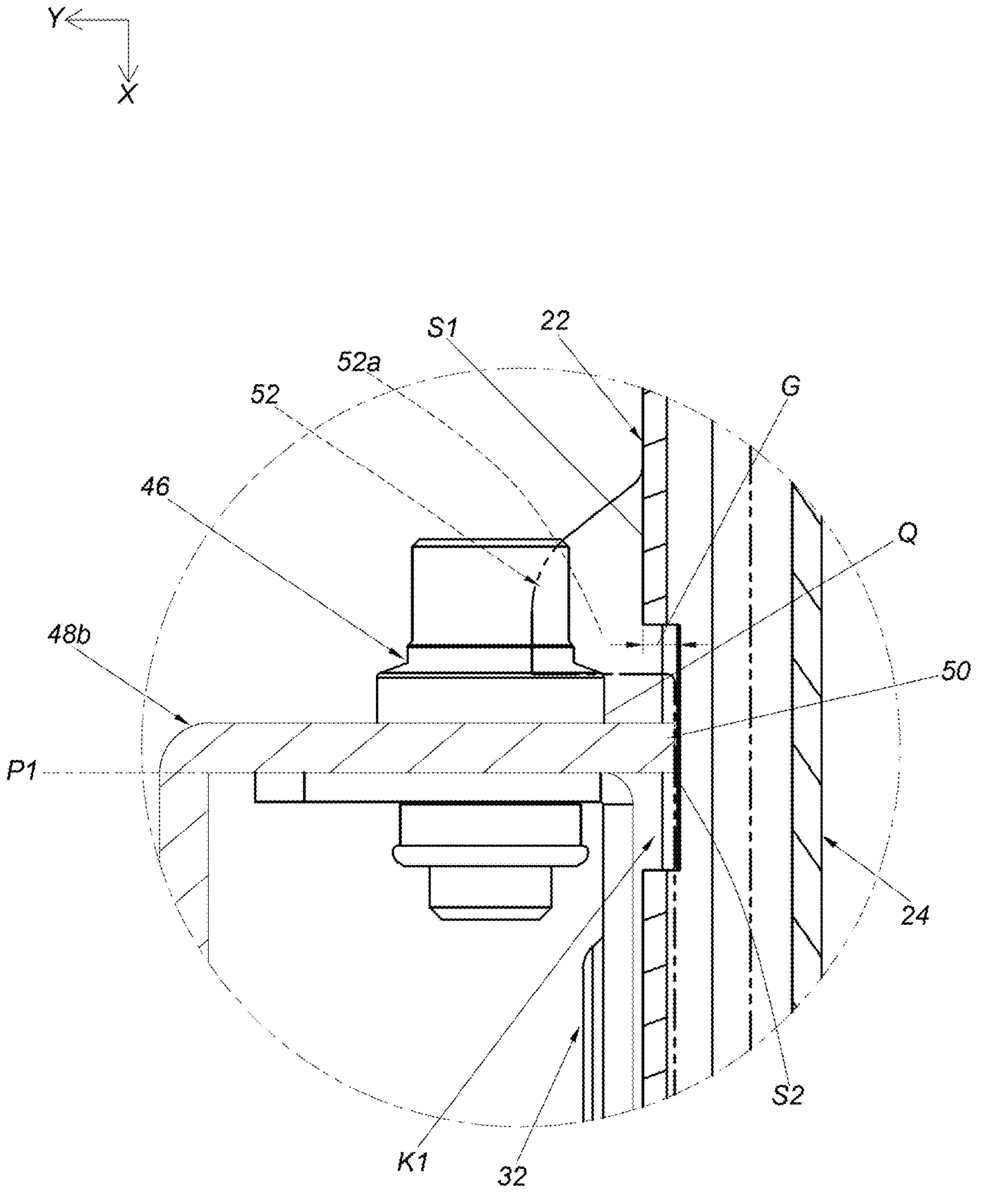
FIG. 7 is an enlarged view of an area A of FIG. 6.

As shown in FIGS. 5 to 7, a pair of slide rail kits 20 is mounted to a rack (or a cabinet). The slide rail kits 20 have substantially identical structural configuration. The slide rail kits 20 are mounted to a first side frame M1 and a second side frame M2 of the rack respectively. The first side frame M1 and the second side frame M2 are located at opposite positions, such as the left side and the right side of the rack, but the present invention is not limited thereto. Configuration of mounting the slide rail kit 20 to the first side frame M1 is substantially identical to configuration of mounting the slide rail kit 20 to the second side frame M2.

A first width W1 is defined between the first side frame M1 and the second side frame M2 of the rack. In the present embodiment, the first side frame M1 of the rack (or the second side frame M2 of the rack) comprises a first post 48*a* and a second post 48*b*, such as a front post and a rear post, but the present invention is not limited thereto. On the other hand, a second width W2 is defined between the second rails 24 of the pair of slide rail kits 20. The second width W2 is equal to a width of a carried object (not shown) carried by the second rails 24 of the pair of slide rail kits 20.

Moreover, the first rail 22 of one of the slide rail kits 20 is configured to be mounted to the first side frame M1 of the rack through the bracket device 28, and the recessed structure K1 of the first rail 22 is configured to allow a predetermined part 50 of the first side frame M1 of the rack to transversely extend into the concave space (as shown in FIG. 7). In other words, the recessed structure K1 of the first rail 22 can accommodate at least a portion of the predetermined part 50 of the second post 48*b*, such that the whole first rail 22 is not required to be placed within a space between the front post 48*a* and the rear post 48*b* of the rack. Therefore, the length of the first rail 22 is not limited by the first post 48*a* and the second post 48*b*.

Compared with the first rail of the prior art that is not provided with the recessed structure, the recessed structure K1 of the first rail 22 in the present embodiment of the present invention allows the predetermined part 50 of the first side frame M1 of the rack to transversely extend into the concave space provided by the recessed structure K1. The first rail 22 of the slide rail kit 20 is configured to accommodate at least a portion of the predetermined part 50 of the first side frame M1 of the rack according to the transverse space range of the concave space defined by the transverse distance G, such that the second width W2 defined between the second rails 24 of the pair of slide rail kits 20 can be increased in order to allow the second rails 24 of the pair of slide rail kits 20 to carry a carried object having a greater width. The predetermined part 50 can be a post edge of the second post 48*b*. In contrast to the prior art, the recessed structure K1 arranged on the first rail 22 can allow the predetermined part 50 of the first side frame M1 of the rack to transversely extend into the concave space, thus the length of the first rail 22 does not need to be shorten under the same specifications and conditions, in order to meet different market requirements.

Furthermore, when the first rack mounting feature 44 of the first bracket 30 is mounted to the first post 48*a* (for example, the first rack mounting feature 44 is inserted into a corresponding hole of the first post 48*a* hole as shown in FIG. 5 and FIG. 6), and when the second bracket 32 is located at an mounting position (such as the first mounting position P1) relative to the first rail 22, the second rack mounting feature 46 of the second bracket 32 is configured to be mounted to the second post 48*b* (for example, the second rack mounting feature 46 is inserted into a corresponding hole of the second post 48*b*). As such, the recessed structure K1 is located adjacent to a lateral side Q of the second rack mounting feature 46 of the second bracket 32 (please refer to FIG. 7).

Preferably, the second bracket 32 further comprises a locking member 52, which is pivoted relative to the second bracket 32 through a shaft member 54. A locking part 52*a* of the locking member 52 is configured to lock the second bracket 32 to the second post 48*b* (shown in FIG. 7).

Figure 8:
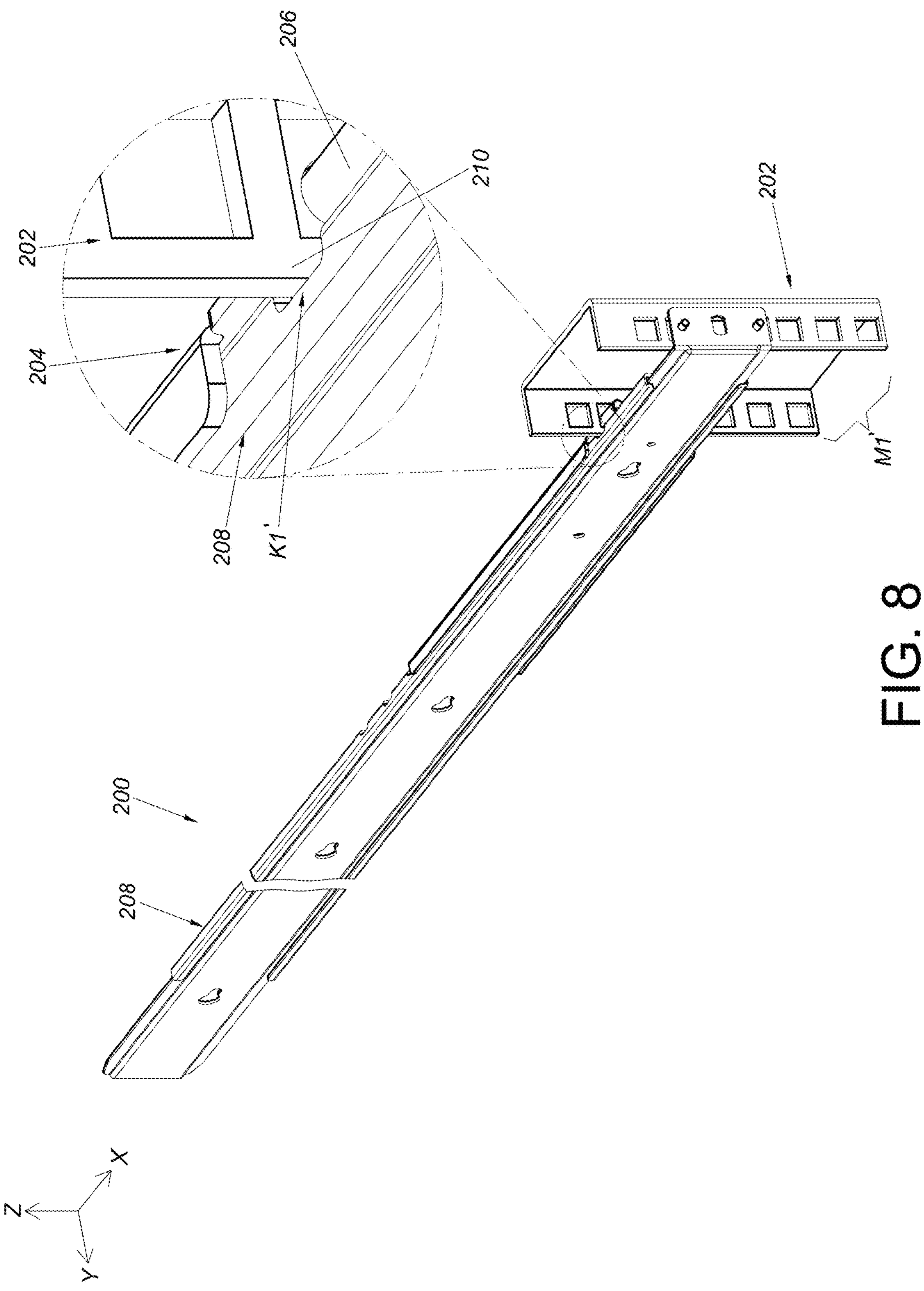
FIG. 8 is a diagram showing a slide rail kit being mounted to a first side frame of a rack according to a second embodiment of the present invention.

FIG. 8 shows a slide rail kit 200 and a first side frame M1' (or a second side frame) of a rack according to a second embodiment of the present invention. Furthermore, different form the first side frame M1 (or the second side frame M2) of the rack of the first embodiment comprising the first post 48*a* and the second post 48*b*, the first side frame M1' of the rack of the second embodiment comprises a signal post 202.

Similar to the first embodiment, a rack mounting feature 206 of a bracket of a bracket device 204 of the slide rail kit 200 is configured to mount the slide rail kit 200 to the first side frame M1' of the rack. Furthermore, when a first rail 208 of the slide rail kit 200 is mounted to the first side frame M1' of the rack through the bracket device 204, a recessed structure K1' of the first rail 208 is configured to allow a predetermined part 210 (such as a post edge) of the first side frame M1' of the rack to transversely extend into a concave space, so as to achieve substantially the same technical effect as the first embodiment.

Therefore, the slide rail kit 20, 200 according to the embodiments of the present invention has the following technical features:

1. The first rail (22, 208) is configured to be mounted to the first side frame (M1, M1') of the rack through the bracket device (28, 204), and the recessed structure (K1, K1') of the first rail (22, 208) is configured to allow the predetermined part (50, 210) of the first side frame (M1, M1') of the rack to transversely extend into the concave space provided by the recessed structure.
2. The recessed structure (K1, K1') of the first rail (22, 208) is located adjacent to the lateral side of the rack mounting feature (46, 206) of the bracket device (28, 204).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail system, comprising:

a rack having a first side frame and a second side frame, wherein each of the first side frame and the second side frame comprises at least one post; and a slide rail kit comprising:

a first rail having an outer side and an inner side;

a second rail longitudinally movable relative to the first rail and adjacent to the inner side of the first rail; and a bracket device arranged on the first rail and comprising a rack mounting feature;

wherein a recessed structure is formed at the outer side of the first rail and recessed toward the inner side of the first rail;

wherein the post of the first side frame has a predetermined part arranged along a transverse direction of the slide rail kit and formed with a corresponding hole;

wherein the first rail is configured to be mounted to the post of the first side frame of the rack through inserting the rack mounting feature of the bracket device along a longitudinal direction of the slide rail kit into the corresponding hole of the predetermined part, wherein when the rack mounting feature of the bracket device is inserted into the corresponding hole of the predetermined part, at least a portion of the predetermined part of the post of the first side frame is configured to be extended into the recessed structure of the first rail along the transverse direction of the slide rail kit to be accommodated within the recessed structure, and the rack mounting feature of the bracket device is adjacent to the recessed structure of the first rail.

2. The slide rail system of claim 1, further comprising a third rail movably mounted between the first rail and the second rail; wherein the first rail comprises a first wall, a second wall and a longitudinal wall connected between the first wall and the second wall, and a passage is defined by the first wall, the second wall and the longitudinal wall of the first rail to accommodate the third rail.

3. The slide rail system of claim 2, wherein the recessed structure is partially formed on the longitudinal wall and located at the outer side of the first rail.

4. The slide rail system of claim 3, wherein the recessed structure is partially formed on at least one of the first wall and the second wall of the first rail.

5. The slide rail system of claim 1, wherein the recessed structure is formed on a predetermined rail section of the first rail.

6. The slide rail system of claim 3, wherein the longitudinal wall has a plurality of first surfaces and a second surface at the outer side of the first rail, and the second surface is located between the first surfaces; wherein the first surface and the second surface are spaced apart from each other by a transverse distance along the transverse direction of the slide rail kit, wherein the recessed structure is recessed relative to the first surface and the second surface is a bottom surface of the recessed structure.

7. The slide rail system of claim 6, wherein the first surface and the second surface are located at different transverse positions along the transverse direction of the slide rail kit.

8. The slide rail system of claim 6, wherein the longitudinal wall of the first rail comprises a first longitudinal section, a second longitudinal section and a rib connected between the first longitudinal section and the second longitudinal section; each of the first longitudinal section and the second longitudinal section has the first surface, and the rib has the second surface.

9. The slide rail system of claim 1, wherein the first rail has a first end part and a second end part opposite to each other; wherein the recessed structure is located adjacent to one of the first end part and the second end part.

* * * * *